US008750035B2

(12) United States Patent
Bessho et al.

(10) Patent No.: US 8,750,035 B2
(45) Date of Patent: Jun. 10, 2014

(54) MEMORY ELEMENT AND MEMORY DEVICE

(75) Inventors: Kazuhiro Bessho, Kanagawa (JP);
Masanori Hosomi, Tokyo (JP);
Hiroyuki Ohmori, Kanagawa (JP);
Yutaka Higo, Kanagawa (JP); Kazutaka Yamane, Kanagawa (JP); Hiroyuki Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 300 days.

(21) Appl. No.: 13/217,925

(22) Filed: Aug. 25, 2011

(65) Prior Publication Data
US 2012/0057403 A1   Mar. 8, 2012

(30) Foreign Application Priority Data

Sep. 2, 2010   (JP) ................. P2010-196418

(51) Int. Cl.
G11C 11/14   (2006.01)

(52) U.S. Cl.
USPC ........... 365/171; 365/148; 365/158; 977/933; 977/935

(58) Field of Classification Search
USPC ......... 365/48, 55, 62, 66, 74, 78, 80–93, 100, 365/130, 131, 148, 158, 171–173, 209, 213, 365/225.5, 230.07, 232, 243.5; 216/22; 257/421, E21.665; 428/810–816, 428/817–825.1, 826; 438/3; 977/933–935
See application file for complete search history.

(56) References Cited

U.S. PATENT DOCUMENTS

| 6,256,223 | B1 | 7/2001 | Sun |
| 6,845,038 | B1 * | 1/2005 | Shukh ................ 365/171 |
| 7,242,045 | B2 | 7/2007 | Nguyen et al. |
| 7,576,956 | B2 * | 8/2009 | Huai ................ 360/324.2 |
| 7,660,153 | B2 | 2/2010 | Yamane |
| 7,675,129 | B2 * | 3/2010 | Inomata et al. ........... 257/421 |

(Continued)

FOREIGN PATENT DOCUMENTS

| JP | 2003-17782 | 1/2003 |
| JP | 2008-227388 | 9/2008 |

OTHER PUBLICATIONS

L Berger "Emission of spin waves by a magnetic multilayer traversed by a current" Physical Review, vol. 54, 9353, Oct. 1996.

(Continued)

*Primary Examiner* — Harry W Byrne
(74) *Attorney, Agent, or Firm* — K&L Gates LLP

(57) ABSTRACT

There is disclosed a memory element including a memory layer that maintains information through the magnetization state of a magnetic material, a magnetization-fixed layer with a magnetization that is a reference of information stored in the memory layer, and an intermediate layer that is formed of a non-magnetic material and is provided between the memory layer and the magnetization-fixed layer. The storing of the information is performed by inverting the magnetization of the memory layer by using a spin torque magnetization inversion occurring according to a current flowing in the lamination direction of a layered structure having the memory layer, the intermediate layer, and the magnetization-fixed layer, the memory layer includes an alloy region containing at least one of Fe and Co, and a magnitude of an effective diamagnetic field which the memory layer receives during magnetization inversion thereof is smaller than the saturated magnetization amount of the memory layer.

8 Claims, 7 Drawing Sheets

(56) References Cited

U.S. PATENT DOCUMENTS

| | | | |
|---|---|---|---|
| 7,989,223 B2* | 8/2011 | Inomata et al. | 438/3 |
| 2002/0163766 A1* | 11/2002 | Eguchi et al. | 360/324.12 |
| 2006/0018057 A1* | 1/2006 | Huai | 360/324.2 |
| 2006/0044703 A1* | 3/2006 | Inomata et al. | 360/324.1 |
| 2009/0180308 A1* | 7/2009 | Inomata et al. | 365/145 |

OTHER PUBLICATIONS

J.C. Slonczewski "Current-driven excitation of magnetic multilayers" Journal of Magnetism and Magnetic Material, 159, L1-L7, 1996.

Albert, et al. "Spin-polarized current switching of a Co thin film management" Applied Physics Letter, vol. 77, No. 23, p. 3809, 2000.

* cited by examiner

MEMORY ELEMENT AND MEMORY DEVICE

CROSS REFERENCES TO RELATED APPLICATIONS

The present application claims priority to Japanese Priority Patent Application JP 2010-196418 filed in the Japan Patent Office on Sep. 2, 2010, the entire contents of which are hereby incorporated by reference.

BACKGROUND

The present disclosure relates to a memory element and a memory device that have a plurality of magnetic layers and make a record using a spin torque magnetization inversion.

Along with a rapid development of various information apparatuses from mobile terminals to large capacity servers, further high performance improvements such as higher integration, increases in a speed, and lower power consumption have been pursued in elements such as a memory element and a logic element. Particularly, semiconductor non-volatile memory has significantly progressed, and, as a large capacity file memory, flash memory has been spreading, and driving out had disk drives with momentum. Meanwhile, looking at development of code storage or working memory, the development of FeRAM (Ferroelectric Random Access Memory), MRAM (Magnetic Random Access Memory), PCRAM (Phase-Change Random Access Memory), or the like has progressed as a substitute for the current NOR flash memory, DRAM or the like in general use. A part of these is already practical in use.

Among them, the MRAM performs the data storage using the magnetization direction of a magnetic body, such that high speed and nearly unlimited (1015 times or more) rewriting can be made, and therefore the MRAM already has been used in fields such as industrial automation and an airplane. Due to high-speed operation and reliability, the MRAM has been expected to be expanded to code storage or working memory in the near future, but in practice, has challenges related to lowering power consumption and increasing capacity. This is a basic problem caused by the recording principle of MRAM, that is, the method of reversing the magnetization using a current magnetic field generated from an interconnect.

As a method of solving this problem, a recording method not utilizing the current magnetic field, that is, a magnetization inversion method is under review. Particularly, research on a spin torque magnetization inversion has been actively made (for example, refer to Japanese Unexamined Patent Application Publication Nos. 2003-17782 and 2008-227388, a specification of U.S. Pat. No. 6,256,223, Phys. Rev. B, 54, 9353 (1996), and J. Magn. Mat., 159, L1 (1996)).

The memory element of a spin torque magnetization inversion is frequently configured using a MTJ (Magnetic Tunnel Junction) in the same way as MRAM.

This configuration uses a phenomenon when spin-polarized electrons passing through a magnetic layer which is fixed in an arbitrary direction enter another free (the direction is not fixed) magnetic layer, the spin-polarized electrons apply a torque to the free magnetic layer (this is also called a spin transfer torque), and when a current of an arbitrary threshold or more flows, the free magnetic layer is inverted. The rewriting of 0/1 is performed by changing the polarity of the current.

An absolute value of a current for this inversion is 1 mA or less in the case of an element with a scale of approximately 0.1 µm. In addition, this current value decreases in proportion to an element volume, such that scaling is possible. In addition, a word line necessary for the generation of a recording current magnetic field in the MRAM is not necessary, such that there is an advantage in that a cell structure becomes simple.

Hereinafter, the MRAM utilizing spin torque magnetization inversion is referred to as an ST-MRAM (Spin Torque-Magnetic Random Access Memory). Spin torque magnetization inversion may be referred to as a spin injection magnetization inversion. Great expectations are put on the ST-MRAM as a non-volatile memory capable of realizing lower power-consumption and larger capacity while maintaining the merits of the MRAM in that high speed and nearly unlimited rewriting may be performed.

FIGS. 6 and 7 show schematic diagrams of the ST-MRAM. FIG. 6 is a perspective view and FIG. 7 is a cross-sectional view.

A drain region 58, a source region 57, and a gate electrode 51 that make up a selection transistor for the selection of each memory cell are formed, respectively, in a semiconductor substrate 60, such as a silicon substrate, at portions isolated by an element isolation layer 52. Among them, the gate electrode 51 also functions as a word line extending in the front-back direction in FIG. 7.

The drain region 58 is formed commonly to left and right selection transistors in FIG. 7, and an interconnect 59 is connected to the drain region 58.

A memory element 53 having a memory layer in which a magnetization direction is inverted by spin torque magnetization inversion is disposed between the source region 57 and bit lines 56 that are disposed at an upper side and extend in the left-right direction in FIG. 6.

This memory element 53 is configured by, for example, a magnetic tunnel junction element (MTJ element). The memory element 53 has two magnetic layers 61 and 62. In the two magnetic layers 61 and 62, one side magnetic layer is set as a magnetization-fixed layer in which the magnetization direction is fixed, and the other side magnetic layer is set as a magnetization-free layer in which that magnetization direction varies, that is, a memory layer.

In addition, the memory element 53 is connected to each bit line 56 and the source region 57 through the upper and lower contact layers 54, respectively. In this manner, when a current is made to flow to the memory element 53, the magnetization direction of the memory layer may be inverted by spin injection.

SUMMARY

However, in the case of the MRAM, a write interconnect (word line or bit line) is provided separately from the memory element, and the writing of information (recording) is performed by a current magnetic field generated by flowing a current to the write interconnect. Therefore, it is possible to make a sufficient amount of current necessary for the writing flow to the write interconnect.

On the other hand, in regard to the ST-MRAM, it is necessary to invert the magnetization direction of the memory layer by performing spin torque magnetization inversion through a current flowing to the memory element.

Since the writing (recording) of information is performed by directly flowing a current to the memory element as described above, a memory cell is configured by connecting the memory element to a selection transistor to select a memory cell that performs the writing. In this case, the current that flows to the memory element is restricted to a current magnitude capable of flowing to the selection transistor (a saturation current of the selection transistor).

Therefore, it is necessary to perform writing with a current equal to or less than the saturation current of the selection transistor, and it is known that the saturation current of the transistor decreases along with miniaturization, such that for miniaturization of the ST-MRAM, it is necessary to diminish the current flowing to the memory element by improving spin transfer efficiency.

In addition, increase read-out signal strength, it is necessary to secure a large magnetoresistance change ratio, and to realize this, it is effective to adopt the above-described MTJ structure, that is, to configure the memory element in such a manner that an intermediate layer connected to both sides of the memory layer is set to as a tunnel insulating layer (tunnel barrier layer).

In a case where the tunnel insulating layer is used as the intermediate layer, the amount of current flowing to the memory element is restricted to prevent the insulation breakdown of the tunnel insulating layer. That is, it is necessary to restrict the current necessary for the spin torque magnetization inversion in a viewpoint of securing reliability with respect to a repetitive writing of the memory element.

Since such a current value is proportional to a film thickness of the memory layer and is proportional to the square of the saturation magnetization of the memory layer, it may be effective to adjust these (the film thickness or the saturated magnetization) to decrease such a current value (for example, refer to Appl. Phys. Lett., 77, 3809 (2000).

For example, in a specification of U.S. Pat. No. 7,242,045, the fact that when the amount of magnetization (Ms) of the recording material is decreased, the current value may be diminished is disclosed.

However, on the other hand, since the ST-MRAM is a non-volatile memory, it is necessary to stably store such information written by a current. That is, it is necessary to secure stability (thermal stability) with respect to thermal fluctuations in the magnetization of the memory layer.

In addition, in a case where the thermal stability of the memory layer is not secured, an inverted magnetization direction may be re-inverted due to heat (temperature in an operational environment), and result in a writing error.

The memory element in the ST-MRAM is advantageous in scaling compared to the MRAM in the related art, that is, advantageous in that the volume of the memory layer may be small as described above from the viewpoint of the recording current value. However, as the volume is small, the thermal stability may be deteriorated as long as other characteristics are the same.

Therefore, the capacity increase of the ST-MRAM proceeds, the volume of the memory element becomes smaller, such that it is important to secure the thermal stability.

Therefore, in regard to the memory element of the ST-MRAM, the thermal stability is a significantly important characteristic, and it is necessary to design the memory element in such a manner that the thermal stability thereof is secured even when the volume is diminished.

That is, to realize the ST-MRAM as a not-volatile memory, it is necessary to decrease the current necessary for spin torque magnetization inversion to a current equal to or less than a saturation current of the transistor or to a current equal to or less than the current at which a tunnel barrier is broken, and further it is necessary to secure the thermal stability for maintaining recorded information.

As described above, to diminish the current necessary for spin torque magnetization inversion, a method of diminishing the saturated magnetization amount Ms of the memory layer or a method of making the memory layer thin is considered. For example, as described in a specification of U.S. Pat. No. 7,242,045, it is effective to use a material having a low saturated magnetization amount Ms as a material of the memory layer.

However, as described above, in the case of simply using the material having a low saturated magnetization amount Ms, it is difficult to secure the thermal stability for maintaining the information.

Therefore, it is desirable to provide a memory element capable of improving thermal stability without increasing the write current, and a memory device including the memory element.

According to an embodiment, there is provided a memory element including a memory layer that maintains information through the magnetization state of a magnetic material; a magnetization-fixed layer with magnetization that is a reference of information stored in the memory layer; and an intermediate layer that is formed of a non-magnetic material and is provided between the memory layer and the magnetization-fixed layer, wherein the storing of the information is performed by inverting the magnetization of the memory layer by using a spin torque magnetization inversion that occurs according to a current flowing in the lamination direction of a layered structure having the memory layer, the intermediate layer, and the magnetization-fixed layer. The memory layer includes an alloy region containing at least one of iron (Fe) and cobalt (Co), and a magnitude of an effective diamagnetic field which the memory layer receives during magnetization inversion thereof is smaller than the saturated magnetization amount of the memory layer.

In addition, the ferromagnetic material making up the memory layer may include a Co—Fe alloy.

In addition, the memory layer may be formed of an alloy expressed by $Co_xFe_{100-x}$, and a direction of an easy axis of magnetization may be perpendicular to a film face, here, x is atomic %, and $0 \leq x \leq 40$.

In addition, the memory layer may be formed of an alloy expressed by $(Co_xFe_{100-x})M_{1-y}$, and a direction of an easy axis of magnetization may be perpendicular to a film face, here, M is an element other than Fe and Co, x and y are atomic %, $0 \leq x \leq 40$, and $0 < y < 100$.

In addition, according to another embodiment, there is provided a memory device which includes a memory element that maintains information through the magnetization state of a magnetic material; and two kinds of interconnects that intersect each other. The memory element include the above-described memory element according to the embodiment, the memory element is disposed between the two kinds of interconnects, and a current flows to the memory element in the lamination direction through the two kinds of interconnects, and according to this, spin torque magnetization inversion occurs.

According to the memory element of the embodiment, the memory layer that maintains information by the magnetization state of the magnetic material is provided, the intermediate layer is provided between the memory layer and the magnetization-fixed layer, and the storing of the information is performed by inverting the magnetization of the memory layer by using a spin torque magnetization inversion that occurs according to the current flowing in the lamination direction, such that it is possible to perform the recording of the information by flowing the current in the lamination direction. At this time, the magnitude of the effective diamagnetic field which the memory layer receives during magnetization inversion thereof is smaller than the saturated magnetization amount of the memory layer, such that the diamagnetic field which the memory layer receives becomes small, and it is possible to diminish the write current value necessary for inverting the magnetization direction of the memory layer.

On the other hand, it is possible to diminish the amount of the write current even when the saturated magnetization amount of the memory layer is not diminished, such that it is possible to secure the saturated magnetization amount necessary for maintaining sufficient thermal stability of the memory layer.

In addition, according to the configuration of the memory device of the embodiment, the current flows to the memory element in the laminated direction through the two kinds of interconnects, and a spin transfer occurs, such that it is possible to perform the recording of information by using a spin torque magnetization inversion by flowing the current in the lamination direction through the two kinds of interconnects.

In addition, it is possible to diminish the amount of write current even when the saturated magnetization amount of the memory layer is diminished, such that the information recorded in the record element is stably maintained, and it is possible to realize miniaturization of the record device, an increase in reliability, and low power-consumption.

According to the embodiments, it is possible to diminish the amount of write current of the memory element even when the saturated magnetization amount of the memory layer is diminished, such that it is possible to configure a memory element excellent in a characteristic balance by sufficiently securing the thermal stability that is the information maintaining ability.

In this manner, it is possible to sufficiently obtain an operation margin of the memory element by eliminating operation error.

Therefore, it is possible to realize a high reliability memory that stably operates.

In addition, the write current is diminished, such that it is possible to diminish power consumption during the writing into the memory element.

Therefore, it is possible to diminish power consumption of the entirety of the memory device.

Additional features and advantages are described herein, and will be apparent from the following Detailed Description and the figures.

DETAILED DESCRIPTION

Embodiments of the present application will be described below in detail with reference to the drawings.

1. Outline of Memory Element of Embodiment
2. Configuration of Embodiment
3. Experiment
1. Outline of Memory Element of Embodiment First, an outline of a memory element of an embodiment according to the present application will be described.

The embodiment according to the present application performs the recording of information by inverting a magnetization direction of a memory layer of a memory element by the above-described spin torque magnetization inversion.

The memory layer is formed of a magnetic material such as ferromagnetic layer, and maintains information through the magnetization state (magnetization direction) of the magnetic material.

Figure 2:
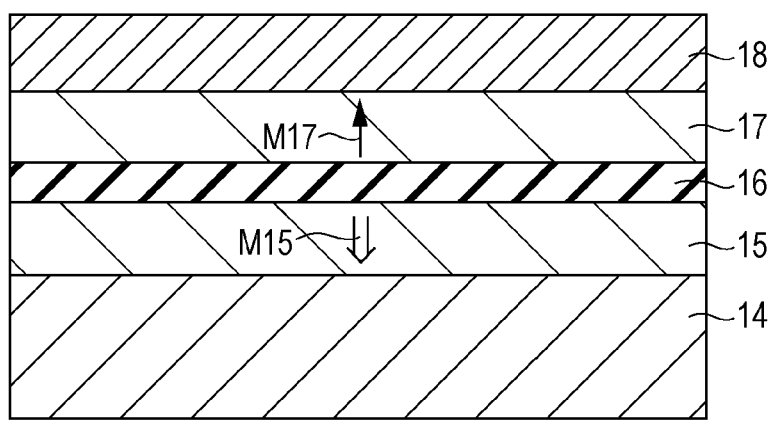
FIG. 2 is a cross-sectional view illustrating a memory element according the embodiment.

The memory element has a layered structure shown as an example in FIG. 2, and includes at least a memory layer 17 and a magnetization-fixed layer 15 as two ferromagnetic layers, and an intermediate layer 16 provided between the two magnetic layers.

The memory layer 17 has a magnetization perpendicular to a film face and a direction of the magnetization varies corresponding to information.

The magnetization-fixed layer 15 has a magnetization that is a reference of information stored in the memory layer 17 and is perpendicular to the film face.

The intermediate layer 16 is formed of a non-magnetic material and is provided between the memory layer 17 and the magnetization-fixed layer 15.

A spin-polarized electron are injected in the lamination direction of a laminated structure having the memory layer 17, the intermediate layer 16, and the magnetization-fixed layer 15, and the magnetization direction of the memory layer 17 is changed and thereby information is recorded in the memory layer 17.

Here, the spin torque magnetization inversion will be briefly described.

The electrons have two kinds of spin angular momentums. These momentums are defined as an upward direction and a downward direction. Both of them are the same in number at the inside of the non-magnetic material, and are different in number at the inside of the ferromagnetic material. In regard to the magnetization-fixed layer 15 and the memory layer 17 that are two layers of ferromagnetic materials making up the ST-MRAM, a case will be considered where the electrons are made to move from the magnetization-fixed layer 15 to the memory layer 17 when a direction of each magnetic moment thereof is in a reverse direction state.

The magnetization-fixed layer 15 is a fixed magnetic layer in which a direction of a magnetic moment is fixed for a high coercive force.

The electrons passed through the magnetization-fixed layer 15 are spin-polarized, that is, the numbers facing upward and downward are different from each other. When the thickness of the intermediate layer 16 that is non-magnetic layer is made to be sufficiently thin, the spin polarization is mitigated after the electrons passed the magnetization-fixed layer 15, and the electrons reach the other magnetic material, that is, the memory layer 17 before the electrons become a non-polarized state in a common non-polarized material (the numbers facing upward and downward are the same).

In the memory layer 17, a symbol of the spin polarization is inverted, such that a part of the electrons is inverted for lowering the system energy, that is, the direction of the spin angular momentum is exchanged. At this time, the entire angular momentum of the system is necessary to be maintained, such that a reaction equal to the total angular momentum by the electron of which the direction is changed is applied to a magnetic moment of the memory layer 17.

In a case where the current, that is, the number of electrons is small, the total number of electrons of which a direction is changed becomes small, such that the change in the angular momentum occurring in the magnetic moment of the memory layer 17 becomes small, but when the current is increased, it is possible to apply large change in the angular momentum within a unit time.

The change of the angular momentum with the passage of time is a torque, and when the torque exceeds a threshold value, the magnetic moment of the memory layer 17 starts a precession, and rotates 180° due to uniaxial anisotropy thereof and becomes stable. That is, the inversion occurs from the reverse direction state to the same direction state.

When the magnetization is the same direction state, if the current is made to reversely flow from the memory layer 17 to the magnetization-fixed layer 15 in the direction of flowing the current, when the electrons that are spin-inverted at that time of being reflected from the magnetic-fixed layer 15 enter the memory layer 17, a torque is applied, and it is possible to invert the magnetic moment to the reverse direction state. However, at this time, the amount of current necessary for causing the inversion is larger than that in the case of inverting from the reverse direction state to the same direction state.

The inversion of the magnetic moment from the same direction state to the reverse direction state is difficult to intuitively understand, but it may be considered that the magnetization-fixed layer 15 is fixed, such that the magnetic moment is not inverted, and the memory layer 17 is inverted for maintaining the angular momentum of the entire system. As described above, the recording of 0/1 is performed by flowing a current of a certain threshold value or more, which corresponds to each polarity, from the magnetization-fixed layer 15 to the memory layer 17 or in an reverse direction thereof.

A read-out of information is performed by using a magnetoresistive effect similarly to the MRAM in the related art. That is, as is the case with the above-described recording, current is made to flow in a direction perpendicular to the film face. In addition, a phenomenon is used where an electrical resistance shown by an element varies according to whether the magnetic moment of the memory layer 17 is the same direction or the reverse direction as the magnetic moment of the magnetization-fixed layer 15.

A material used for the intermediate layer 16 disposed between the magnetization-fixed layer 15 and the memory layer 17 may be a metallic material or an insulating material, but the insulating material may be used for the intermediate layer to obtain a relatively high read-out signal strength (resistance change ratio), and to realize the recording by a relatively low current. The element at this time is called a ferromagnetic tunnel junction (Magnetic Tunnel Junction: MTJ).

When the magnetization direction of the magnetic layer is inverted by spin torque magnetization inversion, a necessary threshold value Ic of a current is expressed by the following equation (1).

$$Ic = A \cdot \alpha \cdot Ms \cdot V \cdot Hd / 2\eta \quad (1)$$

Here, A: constant, $\alpha$: spin braking constant, $\eta$: spin injection efficiency, Ms: saturated magnetization amount, V: volume of memory layer, and Hd: effective diamagnetic field.

As expressed by the equation (1), a threshold value of a current may be set to an arbitrary value by controlling the volume V of the magnetic layer, the saturated magnetization Ms of the magnetic layer, and the spin injection efficiency $\eta$, and the spin braking constant $\alpha$, and may be set to an arbitrary value.

In this embodiment, the memory element includes the magnetic layer (memory layer 17) that is capable of maintaining information through the magnetization state, and the magnetization-fixed layer 15 whose magnetization direction is fixed.

The memory element has to maintain written information so as to function as a memory. This is determined by a value of an index $\Delta$ ($=KV/k_BT$) of thermal stability as an index of ability of maintaining information. The above-described $\Delta$ is expressed by the following equation (2).

$$\Delta = KV/k_BT = Ms \cdot V \cdot H_k \cdot (1/2k_BT) \quad (2)$$

Here, $H_k$: effective anisotropy field, $k_B$: Boltzmann's constant, T: temperature, Ms: amount of saturated magnetism, and V: volume of memory layer.

The effective anisotropy field $H_k$ receives an effect by a shape magnetic anisotropy, an induced magnetic anisotropy, and a crystal magnetic anisotropy, or the like, and when assuming a coherent rotation model of a single domain, the effective anisotropy field becomes the same as the coercive force.

The index $\Delta$ of the thermal stability and the threshold value Ic of the current are often in a trade-off relationship. Therefore, compatibility becomes an issue in maintaining the memory characteristic.

In regard to the threshold value of the current that changes the magnetization state of the memory layer, actually, for example, in a TMR element in which the thickness of the memory layer 17 is 2 nm, and a planar pattern is substantially an elliptical shape of 100 nm×150 nm, a threshold value +Ic of a positive side is +0.5 mA, a threshold value −Ic of a negative side is −0.3 mA, and a current density at this time is substantially 3.5×106 A/cm2. These substantially correspond to the above-described equation (1).

On the contrary, in a common MRAM that performs a magnetization inversion by a current magnetic field, a write current of several mA or more is necessary.

Therefore, in the case of the ST-MRAM, the threshold value of the above-described write current becomes sufficiently small, such that this is effective for diminishing the power consumption of an integrated circuit.

In addition, an interconnect for the generation of the current magnetic field, which is necessary for a common MRAM, is not necessary, such that in regard to the degree of integration, it is advantageous compared to the common MRAM.

In the case of performing the spin torque magnetization inversion, since the writing (recording) of information is performed by directly flowing a current to the memory element, to select a memory cell that performs the writing, the memory element is connected to a selection transistor to construct the memory cell.

In this case, the current flowing to the memory element is restricted to the magnitude of a current (saturated current of the selection transistor) that can be made to flow to the selection transistor.

To make the threshold value Ic of a current of the magnetization inversion by the injection of a spin smaller than the saturated current of the selection transistor, as can be seen from the equation (1), it is effective to diminish the saturated magnetization amount Ms of the memory layer 17.

However, in the case of simply diminishing the saturated magnetization amount Ms (for example, U.S. Pat. No. 7,242, 045), the thermal stability of the memory layer 17 is significantly deteriorated, and therefore it is difficult for the memory element to function as a memory.

To construct the memory, it is necessary that the index Δ of the thermal stability be equal to or greater than a magnitude of a certain degree.

The present inventors have made various studies, and as a result thereof, they have found that when the ferromagnetic layer making up the memory layer 17 is formed of an alloy including cobalt (Co) and iron (Fe), and a composition of Co—Fe is selected, the magnitude of the effective diamagnetic field ($M_{effective}$) which the memory layer 17 receives becomes smaller than the saturated magnetization amount Ms of the memory layer 17.

By using the above-described ferromagnetic material, the magnitude of the effective diamagnetic field which the memory layer 17 receives becomes smaller than the saturated magnetization amount Ms of the memory layer 17.

In this manner, it is possible to make the diamagnetic field which the memory layer 17 receives small, such that it is possible to obtain an effect of diminishing the threshold value Ic of a current expressed by the equation (1) without deteriorating the thermal stability Δ expressed by the equation (2).

In addition, the present inventors has found that Co—Fe magnetizes in a direction perpendicular to a film face within a restricted composition range of the selected Co—Fe composition, and due to this, it is possible to secure a sufficient thermal stability even in the case of a extremely minute recording element capable of realizing Gbit class capacity.

Therefore, in a state where the thermal stability is secured in the ST-MRAM of Gbit class, it is possible to make a stable memory in which information may be written with a low current.

In this embodiment, it is configured such that the magnitude of the effective diamagnetic field which the memory layer 17 receives is made to be less than the saturated magnetization amount Ms of the memory layer 17, that is, a ratio of the magnitude of the effective diamagnetic field with respect to the saturated magnetization amount Ms of the memory layer 17 becomes less than 1.

In addition, a magnetic tunnel junction (MTJ) element is configured by using a tunnel insulating layer formed of an insulating material as the non-magnetic intermediate layer 16 disposed between the memory layer 17 and the magnetization-fixed layer 15 in consideration of the saturated current value of the selection transistor.

The magnetic tunnel junction (MTJ) element is configured by using the tunnel insulating layer, such that it is possible to make a magnetoresistance change ratio (MR ratio) large compared to a case where a giant magnetoresistive effect (GMR) element is configured by using a non-magnetic conductive layer, and therefore it is possible to make read-out signal strength large.

Particularly, when magnesium oxide (MgO) is used as the material of the intermediate layer 16 as the tunnel insulating layer, it is possible to make the magnetoresistance change ratio (MR ratio) large compared to a case where aluminum oxide, which can be generally used, is used.

In addition, generally, the spin transfer efficiency depends on the MR ratio, and as the MR ratio is large, the spin transfer efficiency is improved, and therefore it is possible to diminish the magnetization inversion current density.

Therefore, when magnesium oxide is used as the material of the tunnel insulating material and the memory layer 17 is used, it is possible to diminish the threshold write current by spin torque magnetization inversion and therefore it is possible to perform the writing (recording) of information with a small current. In addition, it is possible to make the read-out signal strength large.

In this manner, it is possible to diminish the writing threshold current by spin torque magnetization inversion by securing the MR ratio (TMR ratio), and it is possible to perform the writing (recording) of information with a small current. In addition, it is possible to make the read-out signal strength large.

As described above, in a case where the tunnel insulating layer is formed of the magnesium oxide (MgO) film, it is desirable that the MgO film is crystallized and therefore a crystal orientation is maintained in (001) direction.

In addition, in this embodiment, in addition to a configuration formed of the magnesium oxide, the intermediate layer 16 (tunnel insulating layer) disposed between the memory layer 17 and the magnetization-fixed layer 15 may be configured by using, for example, various insulating materials, dielectric materials, and semiconductors such as aluminum oxide, aluminum nitride, $SiO_2$, $Bi_2O_3$, $MgF_2$, CaF, $SrTiO_2$, $AlLaO_3$, and Al—N—O.

An area resistance value of the tunnel insulating layer is necessary to be controlled to several tens $\Omega\mu m^2$ or less in consideration of the viewpoint of obtaining a current density necessary for inverting the magnetization direction of the memory layer 17 by spin torque magnetization inversion.

In the tunnel insulating layer formed of the MgO film, to maintain the area resistance value within the above-described range, it is necessary to set the film thickness of the MgO film to 1.5 nm or less.

In addition, it is desirable to make the memory element small to easily invert the magnetization direction of the memory layer 17 with a small current.

Therefore, preferably, the area of the memory element is set to 0.01 μm2 or less.

In addition, elements other than Co and Fe may be added to the memory layer 17 as the embodiment.

When heterogeneous elements are added, there is obtained an effect such as improvement in a heat resistance or increase in a magnetoresistive effect due to the prevention of diffusion, and increase in insulating breakdown voltage accompanied with planarization. As a material of this added element, B, C, N, O, F, Mg, Si, P, Ti, V, Cr, Mn, Ni, Cu, Ge, Nb, Mo, Ru, Rh, Pd, Ag, Ta, W, Ir, Pt, Au, Zr, Hf, Re, Os, or an alloy thereof may be used.

In addition, as the memory layer 17 in this embodiment, a ferromagnetic layer with a different composition may be directly laminated. In addition, a ferromagnetic layer and a soft magnetic layer may be laminated, or a plurality of ferromagnetic layers may be laminated through the soft magnetic layer or a non-magnetic layer. In the case of laminating in this manner, it is possible to obtain an effect in the present application.

Particularly, in a case where the plurality of ferromagnetic layers are laminated through the non-magnetic layer, it is possible to adjust the strength interacting between the ferromagnetic layers, such that even when the dimensions of the memory element is under sub-micron, there is obtained an effect of controlling magnetization inversion current not to be large. As a material of the non-magnetic layer in this case, Ru, Os, Re, Ir, Au, Ag, Cu, Al, Bi, Si, B, C, Cr, Ta, Pd, Pt, Zr, Hf, W, Mo, Nb, or an alloy thereof may be used.

It is desirable that the magnetization-fixed layer 15 and the memory layer 17 have a unidirectional anisotropy.

In addition, it is preferable that the film thickness of each of the magnetization-fixed layer 15 and the memory layer 17 be 0.5 to 30 nm.

Other configuration of the memory element may be the same as the configuration of a memory element that records information by spin torque magnetization inversion in the related art.

The magnetization-fixed layer 15 may be configured in such a manner that the magnetization direction is fixed by only a ferromagnetic layer or by using an antiferromagnetic coupling of an antiferromagnetic layer and a ferromagnetic layer.

In addition, the magnetization-fixed layer 15 may be configured by a single layer of a ferromagnetic layer, or a ferri-pin structure in which a plurality of ferromagnetic layers are laminated through a non-magnetic layer.

As a material of the ferromagnetic layer making up the magnetization-fixed layer 15 of the laminated ferri-pin structure, Co, CoFe, CoFeB, or the like may be used. In addition, as a material of the non-magnetic layer, Ru, Re, Ir, Os, or the like may be used.

As a material of the antiferromagnetic layer, a magnetic material such as an FeMn alloy, a PtMn alloy, a PtCrMn alloy, an NiMn alloy, an IrMn alloy, NiO, and Fe2O3 may be exemplified.

In addition, a magnetic characteristic may be adjusted by adding a non-magnetic element such as Ag, Cu, Au, Al, Si, Bi, Ta, B, C, O, N, Pd, Pt, Zr, Hf, Ir, W, Mo, and Nb to the above-describe magnetic materials, or in addition to this, various physical properties such as a crystalline structure, a crystalline property, a stability of a substance, or the like may be adjusted.

In addition, in relation to a film configuration of the memory element, the memory layer 17 may be disposed at the lower side of the magnetization-fixed layer 15, or at the upper side thereof, and in any disposition, there is no problem at all. In addition, there is no problem at all in a case where the magnetization-fixed layer 15 is disposed at the upper side and the lower side of the memory layer 17, so-called dual-structure.

In addition, as a method of reading-out information recorded in the memory layer 17 of the memory element, a magnetic layer that becomes a reference of information is provided on the memory layer 17 of the memory element through a thin insulating film, and the reading-out may be performed by a ferromagnetic tunnel current flowing through the insulating layer (intermediate layer 16), or the reading-out may be performed by a magnetoresistive effect.

2. Configuration of Embodiment

Subsequently, a specific configuration of this embodiment will be described.

Figure 1:
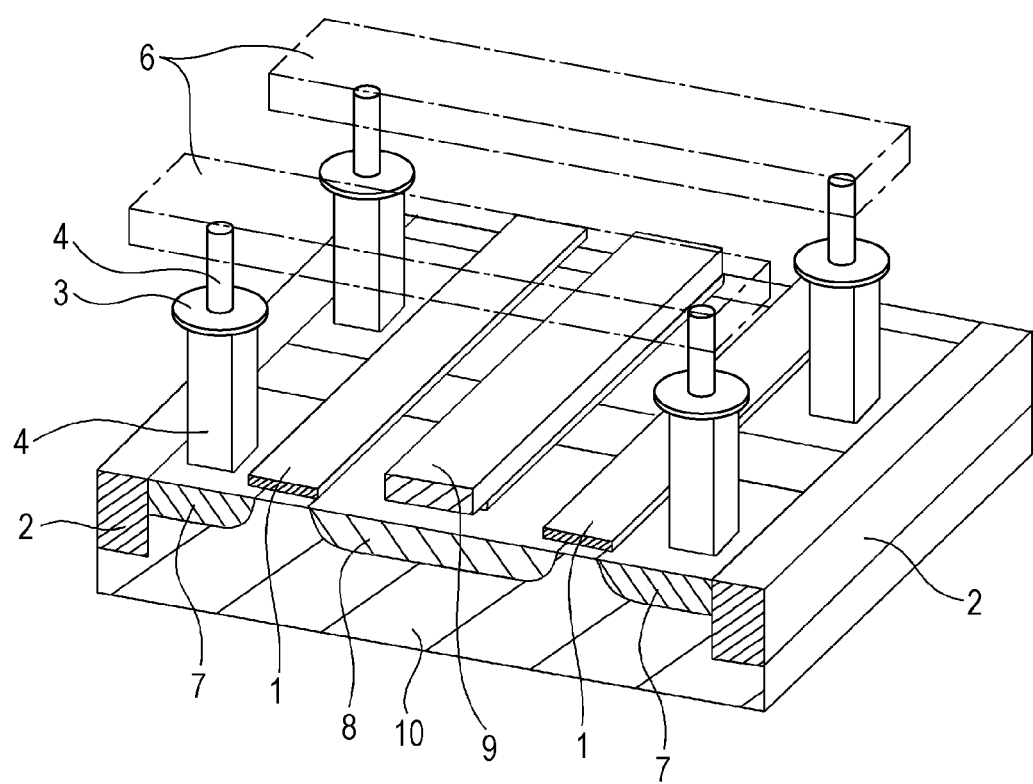
FIG. 1 is an explanatory view illustrating a schematic configuration of a memory according to an embodiment.

As an embodiment, a schematic configuration diagram (perspective view) of a memory device is shown in FIG. 1.

This memory device includes a memory element 3, which can maintain information at a magnetization state, disposed in the vicinity of an intersection of two kinds of address interconnects (for example, a word line and a bit line) that are perpendicular to each other.

Specifically, a drain region 8, a source region 7, and a gate electrode 1 that make up a selection transistor that selects each memory cell are formed in a portion separated by an element separation layer 2 of a semiconductor substrate 10 such as a silicon substrate, respectively. Among them, the gate electrode 1 also functions as one side address interconnect (for example, a word line) that extends in the front-back direction in the drawing.

The drain region 8 is formed commonly with left and right selection transistors in the drawing, and an interconnect 9 is connected to the drain region 8.

The memory element 3 is disposed between the source region 7, and the other side address interconnect (for example, a bit line) 6 that is disposed at an upper side and extends in the left-right direction in the drawing. This memory element 3 has a memory layer including a ferromagentic layer whose magnetization direction is inverted by the injection of a spin.

In addition, the memory element 3 is disposed in the vicinity of an intersection of two kinds of address interconnects 1 and 6.

The memory element 3 is connected to the bit line 6 and the source region 7 through upper and lower contact layers 4, respectively.

In this manner, a current flows into the memory element 3 in the perpendicular direction thereof through the two kind of address interconnects 1 and 6, and the magnetization direction of the memory layer may be inverted by a spin torque magnetization inversion.

In addition, a cross-sectional view of the memory element 3 of the memory device according to this embodiment is shown in FIG. 2.

As shown in FIG. 2, the memory element 3 has a magnetization-fixed layer 15 provided at a lower layer in relation to a memory layer 17 in which the magnetization direction of a magnetization M17 is inverted by a spin torque magnetization inversion.

In regard to an ST-MRAM, 0 and 1 of information are defined by a relative angle between the magnetization M17 of the memory layer 17 and a magnetization M15 of the magnetization-fixed layer 15.

An intermediate layer 16 that serves as a tunnel barrier layer (tunnel insulating layer) is provided between the memory layer 17 and the magnetization-fixed layer 15, and therefore an MTJ element is configured by the memory layer 17 and the magnetization-fixed layer 15.

In addition, an underlying layer 14 is formed under the magnetization-fixed layer 15, and a cap layer 18 is formed on the memory layer 17.

In this embodiment, particularly, a composition of the memory layer 17 of the memory element 3 is adjusted such that a magnitude of an effective diamagnetic field which the memory layer 17 receives becomes smaller than the saturated magnetization amount Ms of the memory layer 17.

That is, as described above, a composition of a ferromagnetic material Co—Fe of the memory layer 17 is selected, and the magnitude of the effective diamagnetic field which the memory layer 17 receives is made to be small, such that the magnitude of the effective diamagnetic field becomes smaller than the saturated magnetization amount Ms.

In addition, in this embodiment, in a case where the intermediate layer 16 is formed of a magnesium oxide layer, it is possible to make a magnetoresistive change ratio (MR ratio) high.

When the MR ratio is made to be high as described above, the spin injection efficiency is improved, and therefore it is possible to diminish the current density necessary for inverting the direction of the magnetization M17 of the memory layer 17.

The memory element 3 of this embodiment can be manufactured by continuously forming from the underlying layer 14 to the cap layer 18 in a vacuum apparatus, and then by forming a pattern of the memory element 3 by a processing such as a subsequent etching or the like.

According to the above-described embodiment, the memory layer 17 of the memory element 3 is configured in such a manner that the magnitude of the effective diamagnetic field that the memory layer 17 receives is smaller than the saturated magnetization amount Ms of the memory layer 17, such that the diamagnetic field that the memory layer 17 receives is decreased, and it is possible to diminish the amount of write current necessary for inverting the direction of the magnetization M17 of the memory layer 17.

On the other hand, since the amount of write current may be diminished even when the saturated magnetization amount Ms of the memory layer 17 is not diminished, it is possible to sufficiently secure the saturated magnetization amount of the memory layer 17 and therefore it is possible to sufficiently secure the thermal stability of the memory layer 17.

As described above, since it is possible to sufficiently secure the thermal stability that is the information maintaining ability, it is possible to configure the memory element 3 excellent in a characteristic balance.

In this manner, an operation error is removed and an operation margin of the memory element 3 is sufficiently obtained, such that it is possible to stably operate the memory element 3.

Accordingly, it is possible to realize a memory that stably operates with high reliability.

In addition, the write current is diminished, such that it is possible to diminish the power consumption when performing the writing into the memory element 3.

Therefore, it is possible to diminish the power consumption of the entirety of the memory in which a memory cell is configured by the memory element 3 of this embodiment.

Therefore, in regard to the memory including the memory element 3 capable of realizing a memory that is excellent in the information maintaining ability, has high reliability, and operates stably, it is possible to diminish the power consumption.

In addition, the memory that includes a memory element 3 shown in FIG. 2 and has a configuration shown in FIG. 1 has an advantage in that a general semiconductor MOS forming process may be applied when the memory is manufactured.

Therefore, it is possible to apply the memory of this embodiment as a general purpose memory.

3. Experiment

Here, in regard to the configuration of the memory element 3 of this embodiment, by specifically selecting the material of the ferromagnetic layer making up the memory layer 17, the magnitude of the effective diamagnetic field that the memory layer 17 receives was adjusted, and thereby a sample of the memory element 3 was manufactured, and then characteristics thereof was examined.

In an actual memory device, as shown in FIG. 1, a semiconductor circuit for switching or the like present in addition to the memory element 3, but here, the examination was made on a wafer in which only the memory element is formed for the purpose of investigating the magnetization inversion characteristic of the memory layer 17.

Experiment 1

A thermal oxide film having a thickness of 300 nm was formed on a silicon substrate having a thickness of 0.725 mm, and the memory element 3 having a configuration shown in FIG. 2 was formed on the thermal oxide film.

Specifically, in regard to the memory element 3 shown in FIG. 1, a material and a film thickness of each layer were selected as described below.

Underlying layer 14: Laminated film of a Ta film having a film thickness of 10 nm and a Ru film having a film thickness of 25 nm Magnetization-fixed layer 15: CoFeB film having a film thickness of 2.5 nm Intermediate layer (tunnel insulating layer) 16: Magnesium oxide film having a film thickness of 0.9 nm Memory layer 17: CoFe film Cap layer 18: Laminated film of a Ta film having a film thickness of 3 nm, a Ru film having a thickness of 3 nm, and a Ta film having a thickness of 3 nm Each layer was selected as described above, a Cu film (not shown) having a film thickness of 100 nm (serving as a word line described below) was provided between the underlying layer 14 and the silicon substrate.

In the above-described configuration, the ferromagnetic layer of the memory layer 17 was formed of a binary alloy of Co—Fe, and a film thickness of the ferromagnetic layer was fixed to 2.0 nm.

Each layer other than the intermediate layer 16 formed of a magnesium oxide film was formed using a DC magnetron sputtering method.

The intermediate layer 16 formed of the magnesium oxide (MgO) film was formed using a RF magnetron sputtering method.

In addition, after forming each layer of the memory element 3, a heating treatment was performed in a magnetic field heat treatment furnace.

Next, after masking a word line portion by a photolithography, a selective etching by Ar plasma was performed with respect to a laminated film other than the word line portion, and thereby the word line (lower electrode) was formed. At this time, a portion other than the word line was etched to the depth of 5 nm in the substrate.

Then, a mask of a pattern of the memory element 3 by an electron beam drawing apparatus was formed, a selective etching was performed with respect to the laminated film, and thereby the memory element 3 was formed. A portion other than the memory element 3 was etched to a portion of the word line immediately over the Cu layer.

In addition, in the memory device for the characteristic evaluation, it is necessary to make a sufficient current flow to the memory element so as to generate a spin torque necessary for the magnetization inversion, such that it is necessary to suppress the resistance value of the tunnel insulating layer. Therefore, a pattern of the memory element 3 was set to an elliptical shape having a short axis of 0.09 μm×a long axis of 0.18 μm, and an area resistance value ($\Omega\mu m^2$) of the memory element 3 was set to 20 $\Omega\mu m^2$.

Next, a portion other than the memory element 3 was insulated by sputtering $Al_2O_3$ to have a thickness of substantially 100 nm.

Then, a bit line serving as an upper electrode and a measurement pad were formed by using photolithography.

In this manner, a sample of the memory element 3 was manufactured.

By the above-described manufacturing method, each sample of the memory element 3 in which a composition of Co—Fe alloy of the ferromagnetic layer of the memory layer 17 was changed was manufactured.

In the composition of the Co—Fe alloy, a Co composition ratio of Co in CoFe, that is, x (atomic %) was changed to 90%, 80%, 70%, 60%, 50%, 40%, 30%, 20%, 10%, and 0%.

With respect to each sample of the memory element 3 manufactured as described above, a characteristic evaluation was performed as described below.

Before the measurement, it was configured to apply a magnetic field to the memory element 3 from the outside to control an inversion current in such a manner that a value in a plus direction and a value in a minus direction to be symmetric to each other. In addition, a voltage applied to the memory element 3 was set up to 1 V within a range without breaking down the insulating layer (intermediate layer 16).

Measurement of Saturated Magnetization Amount

The saturated magnetization amount Ms was measured by a VSM measurement using a Vibrating Sample Magnetometer.

Measurement of Effective Diamagnetic Field

As a sample for measuring an effective diamagnetic field, in addition to the above-described sample of the memory element 3, a sample in which each layer making up the memory element 3 was formed was manufactured and then the sample was processed to have a planar pattern of 20 mm×20 mm square.

In addition, a magnitude $M_{\text{effective}}$ an effective diamagnetic field was obtained by FMR (Ferromagnetic Resonance) measurement.

A resonance frequency fFMR, which is obtained by the FMR measurement, with respect to arbitrary external magnetic field $H_{ex}$ is given by the following equation (3).

$$f_{FMR} = \gamma \sqrt{4\pi M_{\text{effective}}(H_K + H_{ex})} \quad (3)$$

Here, $M_{\text{effective}}$ in the equation (3) may be expressed by $4\pi M_{\text{effective}} = 4\pi Ms - H\perp$ (H⊥: anisotropy field in a direction perpendicular to a film face).

Measurement of Inversion Current Value and Thermal Stability

An inversion current value was measured for the purpose of evaluating the writing characteristic of the memory element 3 according to this embodiment.

A current having a pulse width of 10 μs to 100 ms is made to flow to the memory element 3, and then a resistance value of the memory element 3 was measured. In addition, the amount of current that flows to the memory element 3 was changed, and then a current value in which a direction of the magnetization M1 of the memory layer 17 of the memory element 3 was inverted was obtained. A value obtained by extrapolating a pulse width dependency of this current value to a pulse width 1 ns was set to the inversion current value.

In addition, the inclination of a pulse width dependency of the inversion current value corresponds to the above-described index Δ of the thermal stability of the memory element 3. The less the inversion current value is changed (the inclination is small) by the pulse width, the more the memory element 3 is strong against disturbance of the heat.

In addition, twenty memory elements 3 with the same configuration were manufactured to take variation in the memory element 3 itself into consideration, the above-described measurement was performed, and an average value of the inversion current value and the index Δ of the thermal stability were obtained.

In addition, an inversion current density Jc0 was calculated from the average value of the inversion current value obtained by the measurement and an area of the planar pattern of the memory element 3.

In regard to each sample of the memory element 3, a composition of Co—Fe alloy of the storage layer 17, measurement results of the saturated magnetization amount Ms and the magnitude $M_{\text{effective}}$ of the effective diamagnetic field, and a ratio $M_{\text{effective}}/Ms$ of effective diamagnetic field to the saturated magnetization amount were shown in Table 1. Here, the amount of Co of Co—Fe alloy of the memory layer 17 described in Table 1 was expressed by an atomic %.

TABLE 1

|  | Ms[emu/cc] | Meffective[emu/cc] | Meffective/Ms |
|---|---|---|---|
| Co90Fe10 | 1250 | 1500 | 1.2 |
| Co80Fe20 | 1410 | 1440 | 1.02 |
| Co70Fe30 | 1760 | 1510 | 0.86 |
| Co60Fe40 | 1820 | 1440 | 0.79 |
| Co50Fe50 | 1880 | 1260 | 0.67 |
| Co40Fe60 | 1890 | 1100 | 0.58 |
| Co30Fe70 | 1970 | 1060 | 0.54 |
| Co20Fe80 | 1900 | 950 | 0.5 |
| Co10Fe90 | 1830 | 975 | 0.53 |
| Fe | 1750 | 990 | 0.57 |

From the table 1, in a case where the amount x of Co of $Co_xFe_{100-x}$ is 70% or less, the magnitude of the effective diamagnetic field is smaller than the saturated magnetization amount Ms, that is, the ratio of $M_{\text{effective}}/Ms$ in a case where the amount x of Co is 70% or less becomes a value less than 1.0.

In addition, until the amount x of Co becomes 20%, as the amount x of Co decreases, the value of $M_{\text{effective}}/Ms$ decreases, but it was confirmed that when the amount x of Co further decreases, the ratio increases a little.

Figure 3:
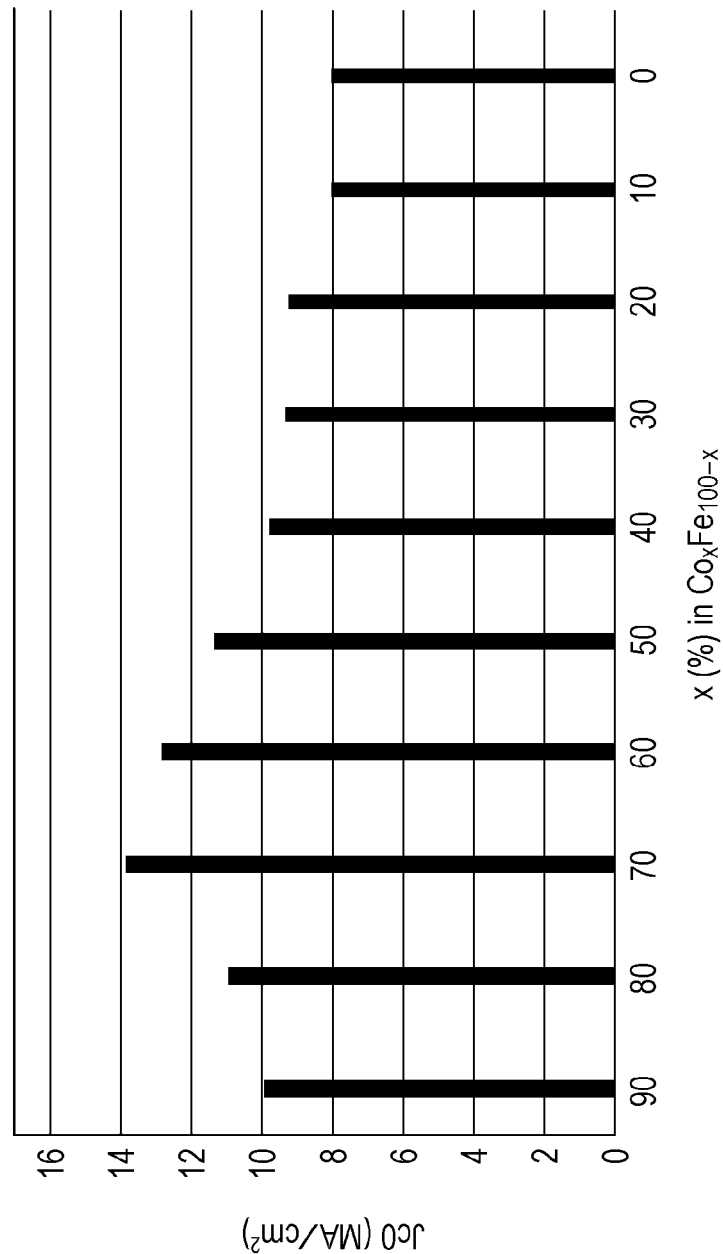
FIG. 3 is a diagram illustrating a relationship between the amount of Co of a memory layer of 0.09×0.18 μm size and an inverted current density.
Figure 4:
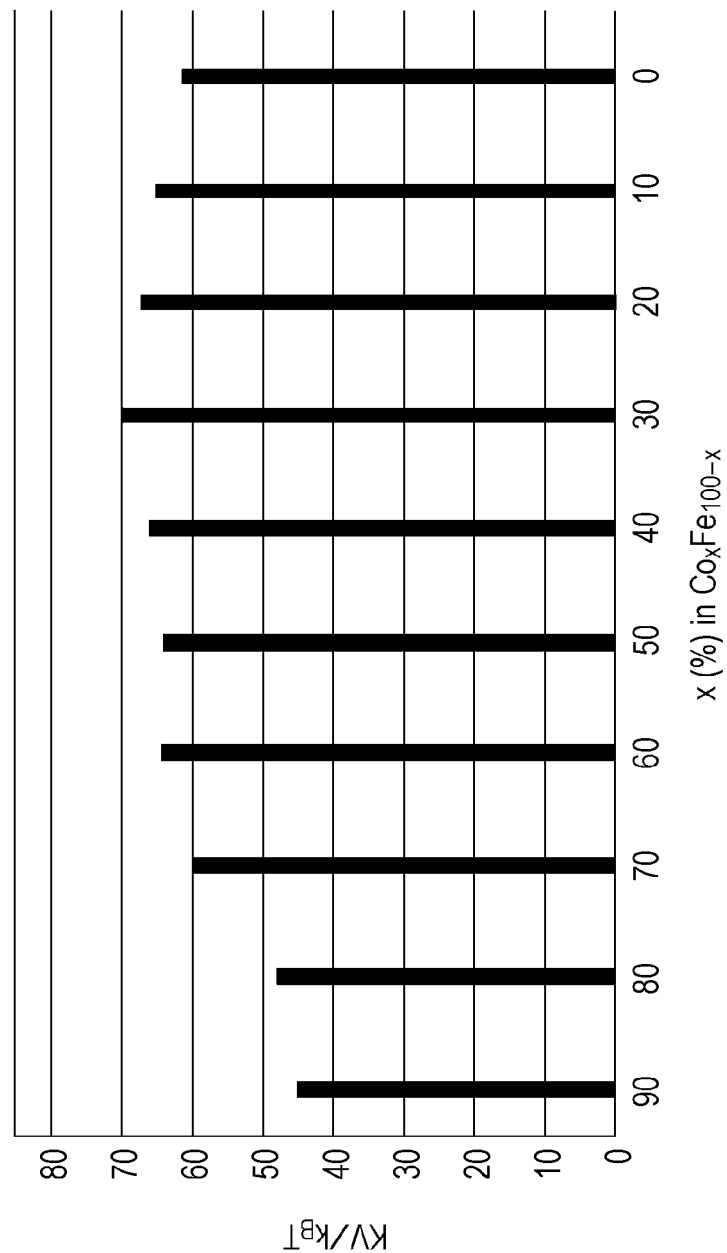
FIG. 4 is a diagram illustrating a relationship between the amount of Co of a memory layer of 0.09×0.18 μm size and an index of thermal stability.

A measurement result of the inversion current value was shown in FIG. 3, and a measurement result of the index of the thermal stability was shown in FIG. 4.

FIG. 3 shows a relationship between the amount x (content in CoFe; atomic %) of Co in the Co—Fe alloy of the memory layer 17 and the inversion current density Jc0 obtained from the inversion current value.

FIG. 4 shows a relationship between the amount x (content in CoFe; atomic %) of Co in the Co—Fe alloy of the memory layer 17 and the index Δ ($kV/k_BT$) of the thermal stability.

As can be seen from FIG. 3, in a case where the amount x of Co is 70% or less, as the amount x of Co decreases, the inversion current density Jc0 decreases.

This is because in a case where the amount x of Co becomes small, the saturated magnetization amount Ms increases, but the effective diamagnetic field $M_{\text{effective}}$ decreases, and therefore the product of them $Ms \times M_{\text{effective}}$ becomes small.

As can be seen from FIG. 4, as the amount x of Co decreases, the index Δ ($KV/k_BT$) of the thermal stability increases, and in a case where the amount x of Co is 70% or less, the index Δ of the thermal stability becomes stable to a large value.

This well corresponds to a change that is expected from the measurement result of the saturated magnetization amount Ms shown in Table 1 and a tendency where the index Δ of the thermal stability from the equation (2) is proportional to the saturated magnetization amount Ms.

As is clear from the results of Table 1, FIGS. 3 and 4, in a composition where the amount x of Co is 70% or less and the effective diamagnetic field $M_{\text{effective}}$ is less than the saturated magnetization amount Ms, it is possible to diminish the inversion current value Jc0 with a high thermal stability maintained, without using a method in which Ms is decreased and therefore the thermal stability is sacrificed.

Experiment 2

As can be seen from the above-described experiment 1, in the case of $Co_xFe_{100-x}$, it is possible to diminish the inversion current value Jc0 with a high thermal stability maintained in a composition where the amount x of Co is 70% or less.

Therefore, in an experiment 2, B (boron) was added to the Co—Fe alloy to investigate an addition effect a heterogeneous element, and an effect on the $M_{\text{effective}}/Ms$, which is caused by B, was examined by using a memory layer 17 having a composition $(Co_{50}Fe_{50})_{92}B_8$. The details of the sample were substantially the same as those in the experiment 1.

As a result thereof, in regard to $(Co_{50}Fe_{50})_{92}B_8$, values of the saturated magnetization amount Ms and the magnitude $M_{effective}$ of the effective diamagnetic field were 1550 (emu/cc) and 950 (emu/cc), respectively, and a value of a ratio $M_{effective}/MS$ of the magnitude of the effective diamagnetic field to the saturated magnetization amount Ms was 0.61.

That is, it was clear from the result that even when 8 atomic % of boron was added, the relationship of the saturated magnetization amount Ms and the magnitude of the effective diamagnetic field $M_{effective}$ was determined by a ratio of Co and Fe.

Therefore, it was considered that the configuration where the saturated magnetization amount Ms of the memory layer 17 was made to be smaller than the effective diamagnetic field $M_{effective}$ was not hindered by the addition of the heterogeneous element. That is, an additive element such as boron may be added for the purpose of generating a high tunnel magnetoresistive effect, for the purpose of increasing an insulating break-down voltage through the planarization of an interface, or the like.

Experiment 3

In a spin injection type memory of a Gbit class, it was assumed that the size of the recording element was 100 nmφ or less. Here, in an experiment 3, the thermal stability was evaluated by using a memory element having a size of 50 nmφ.

In the composition of Co—Fe alloy, a composition ratio x (atomic %) in CoFe was changed to 90%, 80%, 70%, 60%, 50%, 40%, 30%, 20%, 10%, and 0%, respectively. The details of a sample other than the element size were substantially the same as those in the experiment 1.

Figure 5:
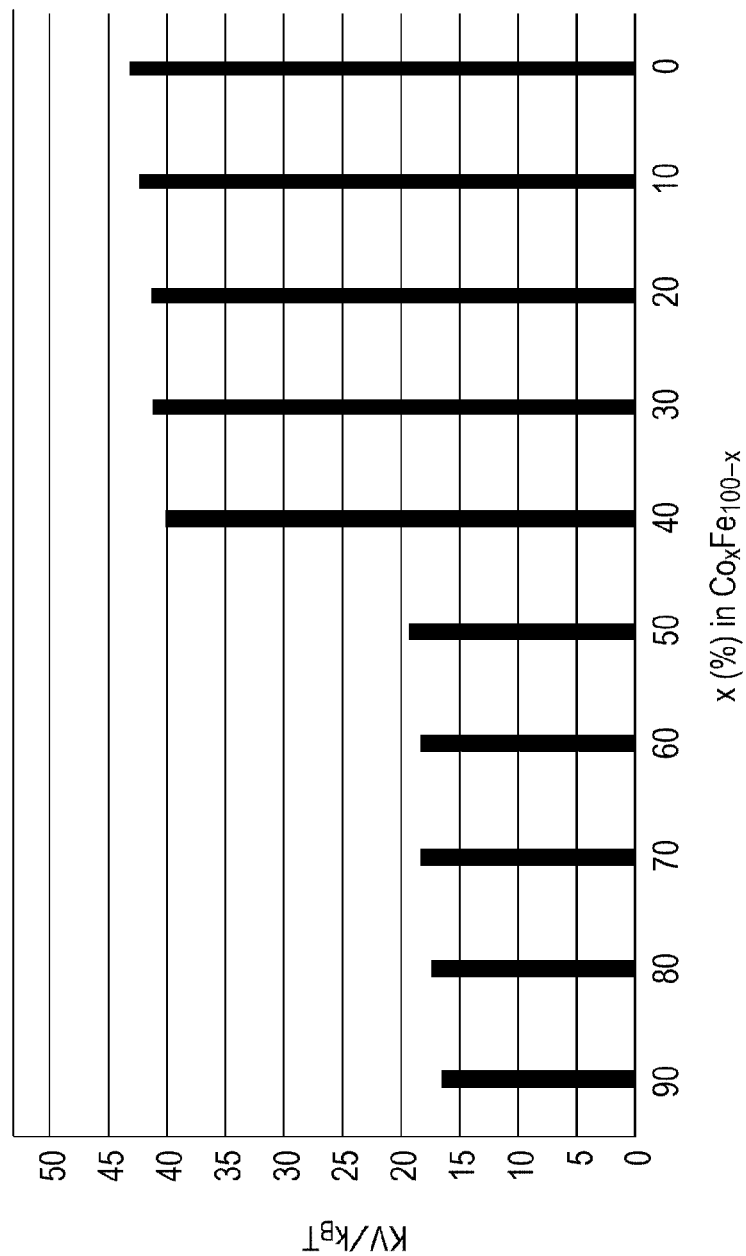
FIG. 5 is a diagram illustrating a relationship between the amount of Co of a memory layer of 0.05×0.05 μm size and an index of thermal stability.
Figure 6:
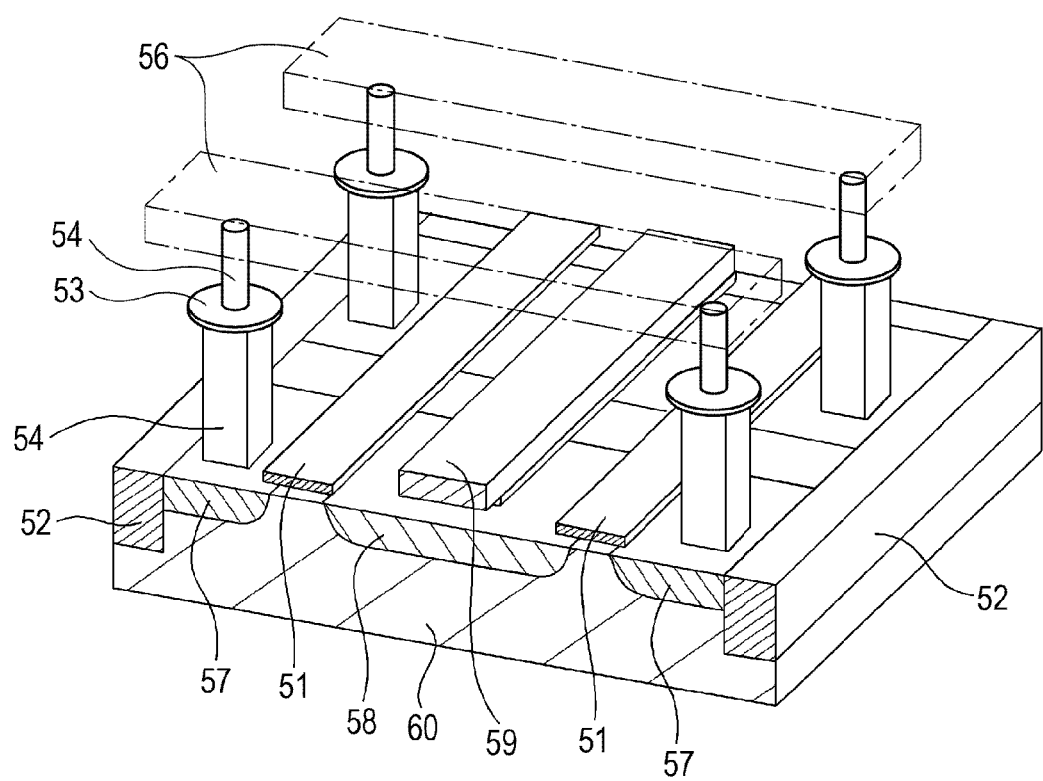
FIG. 6 is an explanatory view illustrating a schematic configuration of a ST-MRAM.
Figure 7:
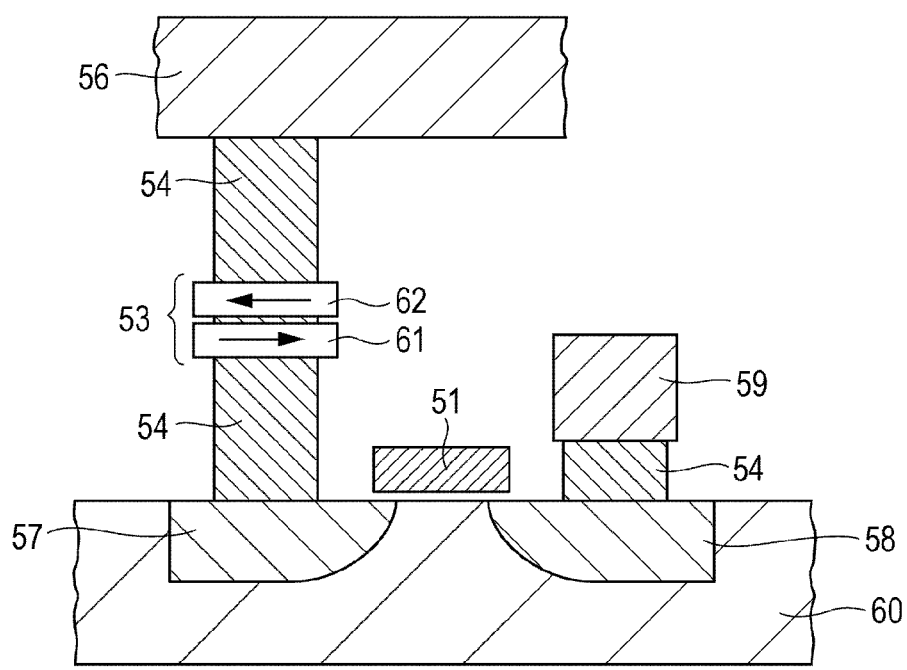
FIG. 7 is a cross-sectional view of the ST-MRAM of FIG. 6.

In a case where the size of the memory element 3 was 50 nmφ, a relationship between the amount of Co (content in CoFe; atomic %) in the Co—Fe alloy, and the index Δ (KV/$k_BT$) of the thermal stability were shown in FIG. 5.

As can be seen from FIG. 5, when the element size was 50 nmφ, Co—Fe alloy composition dependency of the thermal stability index Δ was largely varied from the Co—Fe alloy composition dependency of Δ obtained in the elliptical memory element having a short axis of 0.09×a long axis of 0.18 μm shown in FIG. 4.

According to FIG. 5, the high thermal stability was maintained only in the case of Co—Fe alloy composition where Co is 40% or less, that is, Fe is 60% or more.

As a result of various reviews, it was clear the reason why the Co—Fe alloy containing Fe of 60% or more shown the high thermal stability Δ in the extremely minute memory element was revealed to be because the magnetization of the Co—Fe alloy faced a direction perpendicular to a film face (the direction in which the magnetization becomes stable in a case where the external magnetic field was not present is referred to as "easy axis direction", and can be investigated by measuring external magnetic field dependency of the resistance of the memory element and comparing the direction of the magnetic field at this time between an in-plane direction and a perpendicular direction).

The reason why the magnetization of the Fe—Co alloy faces the direction perpendicular to the film face is considered to be because of a composition in which the saturated magnetization amount Ms is significantly smaller than the effective diamagnetic field $M_{effective}$.

In addition, the reason why the thermal stability is secured even in the case of the extremely minute element of a perpendicular magnetization type is related to Hk (effective anisotropy magnetic field) in the equation (2), and Hk of the perpendicular magnetization film becomes a value significantly larger than that in the in-plane magnetization film. That is, in the perpendicular magnetization film, due to an effect of large Hk, it is possible to maintain a high thermal stability Δ even in the case of the extremely minute element not capable of securing a sufficient thermal stability Δ in the in-plane magnetization film.

From the above-described experiment results, in regard to the Co—Fe alloy, in a case where the amount of Fe is 60% or more, this is appropriate to the ST-MRAM of Gbit class.

Experiment 4

In regard to the Co—Fe alloy expressed by a compositional formula $Co_xFe_{100-x}$ in the above-described experiment 3, it can be seen that in a case where the amount x of Co is 40% or less, this is appropriate to the ST-MRAM of Gbit class.

Therefore, in an experiment 4, B (boron) was added to the Co—Fe alloy to investigate an addition effect a heterogeneous element, and a memory element including the memory layer 17 having a composition $(Co_{30}Fe_{70})_{92}B_8$ and the size of 50 nmφ was manufactured, and then the thermal stability was evaluated. The details of the sample other than the element size and the composition were substantially the same as those in the experiment 1.

In regard to $(Co_{30}Fe_{70})_{92}B_8$, a value of Δ that is an index of the thermal stability was 42. In addition, it was clear that the magnetization of the memory element faced a direction perpendicular to the film face.

It was clear from the results that even when 8 atomic % of boron was added, the thermal stability was largely determined by the composition of Co and Fe, and this was considered to be because an easy axis of magnetization was perpendicular to the film face.

Therefore, it was considered that the configuration where the thermal stability of the memory element was improved by adjusting the composition of the Co—Fe alloy to set the amount of Co to 40% or less was not hindered by the addition of the heterogeneous element. That is, an additive element such as boron may be added for the purpose of generating a high tunnel magnetoresistive effect, for the purpose of increasing an insulating break-down voltage through the planarization of an interface, or the like.

Hereinbefore, embodiments are described, but in the present application, the film configuration of the memory elements 3 and 53 illustrated in each embodiments described above is not limited thereto, and various film configuration may be adopted.

For example, in the embodiments, the magnetization-fixed layer 15 is formed of CoFeB, but the present application is not limited thereto and various configurations are possible without departing from the scope.

In addition, in the embodiments, a single underlying layer, a single cap material, and a single shape of the memory element are illustrated, but the present application is not limited thereto, and various configurations are possible without departing from the scope.

In addition, in the embodiments, the magnetization-fixed layer 15 is formed of a single layer, but a laminated ferri-pin structure including two ferromagnetic layers and a non-magnetic layer may be used. In addition, the configuration may be a configuration where an antiferromagnetic film is applied to the laminated ferri-pin structure film.

In addition, the film configuration of the memory element may be a configuration where the memory layer is disposed at an upper side of the magnetization-fixed layer or at a lower side thereof, and in any disposition, there is no problem at all. In addition, a structure where the magnetization-fixed layer is disposed at upper and lower sides of the memory layer, respectively, so-called a dual-structure has no problem at all.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A memory element, comprising:
a memory layer that maintains information through a magnetization state of a magnetic material;
a magnetization-fixed layer with a magnetization that is a reference of information stored in the memory layer; and
an intermediate layer that is formed of a non-magnetic material and is provided between the memory layer and the magnetization-fixed layer,
wherein the storing of the information is performed by inverting the magnetization of the memory layer by using a spin torque magnetization inversion that occurs according to a current flowing in a lamination direction of a layered structure having the memory layer, the intermediate layer, and the magnetization-fixed layer,
the memory layer includes an alloy region containing cobalt (Co) and iron (Fe), and
a magnitude of an effective diamagnetic field which the memory layer receives during magnetization inversion thereof is smaller than an saturated magnetization amount of the memory layer.

2. The memory element according to claim 1, wherein a ferromagnetic material making up the memory layer includes a Co—Fe alloy.

3. The memory element according to claim 2, wherein the memory layer is formed of an alloy expressed by $Co_xFe_{100-x}$, and a direction of an easy axis of magnetization is perpendicular to a film face,
here, x is atomic %, and $0 \leq x \leq 40$.

4. The memory element according to claim 2, wherein the memory layer is formed of an alloy expressed by $(Co_xFe_{100-x})_yM_{1-y}$, and a direction of an easy axis of magnetization is perpendicular to a film face,
here, M is an element other than Fe and Co, x and y are atomic %, $0 \leq x \leq 40$, and $0 < y < 100$.

5. A memory device, comprising:
a memory element that maintains information through a magnetization state of a magnetic material; and
two kinds of interconnects that intersect each other,
wherein the memory element includes a memory layer that maintains information through a magnetization state of a magnetic material, a magnetization-fixed layer with magnetization that is a reference of information stored in the memory layer, and an intermediate layer that is formed of a non-magnetic material and is provided between the memory layer and the magnetization-fixed layer,
the storing of the information is performed by inverting the magnetization of the memory layer by using a spin torque magnetization inversion that occurs according to a current flowing in a lamination direction of a layered structure having the memory layer, the intermediate layer, and the magnetization-fixed layer,
the memory layer includes an alloy region containing cobalt (Co) and iron (Fe), and
a magnitude of an effective diamagnetic field which the memory layer receives during magnetization inversion thereof is smaller than an saturated magnetization amount of the memory layer,
the memory element is disposed between the two kinds of interconnects, and
a current flows to the memory element in the lamination direction through the two kinds of interconnects, and according to this, spin torque magnetization inversion occurs.

6. The memory device according to claim 5, wherein a ferromagnetic material making up the memory layer includes a Co—Fe alloy.

7. The memory device according to claim 6, wherein the memory layer is formed of an alloy expressed by $Co_xFe_{100-x}$, and a direction of an easy axis of magnetization is perpendicular to a film face, here, x is atomic %, and $0 \leq x \leq 40$.

8. The memory device according to claim 6, wherein the memory layer is formed of an alloy expressed by $(Co_xFe_{100-x})_yM_{1-y}$, and a direction of an easy axis of magnetization is perpendicular to a film face, here, M is an element other than Fe and Co, x and y are atomic %, $0 \leq x \leq 40$, and $0 < y < 100$.

* * * * *